US011211645B2

(12) United States Patent
Yano

(10) Patent No.: US 11,211,645 B2
(45) Date of Patent: Dec. 28, 2021

(54) TEMPERATURE DETECTION CIRCUIT

(71) Applicant: SANYO Electric Co., Ltd., Daito (JP)

(72) Inventor: Junya Yano, Hyogo (JP)

(73) Assignee: SANYO Electric Co., Ltd., Daito (JP)

( * ) Notice: Subject to any disclaimer, the term of this patent is extended or adjusted under 35 U.S.C. 154(b) by 714 days.

(21) Appl. No.: 16/077,918

(22) PCT Filed: Jan. 25, 2017

(86) PCT No.: PCT/JP2017/002432
§ 371 (c)(1),
(2) Date: Aug. 14, 2018

(87) PCT Pub. No.: WO2017/150013
PCT Pub. Date: Sep. 8, 2017

(65) Prior Publication Data
US 2019/0051952 A1    Feb. 14, 2019

(30) Foreign Application Priority Data
Feb. 29, 2016  (JP) .............................. JP2016-038313

(51) Int. Cl.
*H01M 10/48*    (2006.01)
*G01K 7/24*    (2006.01)
(Continued)

(52) U.S. Cl.
CPC ............ *H01M 10/486* (2013.01); *G01K 7/24* (2013.01); *G01R 19/16542* (2013.01);
(Continued)

(58) Field of Classification Search
None
See application file for complete search history.

(56) References Cited

U.S. PATENT DOCUMENTS

2009/0167238 A1*  7/2009  McBee ............... H01M 10/443
                                                        320/101
2013/0002016 A1*  1/2013  Furukawa ........... H01M 10/425
                                                        307/9.1

FOREIGN PATENT DOCUMENTS

CN         1150633 A    5/1997
JP        56-16827 A    2/1981
(Continued)

OTHER PUBLICATIONS

English Translation of Chinese Search Report dated Jan. 7, 2020 for the related Chinese Patent Application No. 201780014179.8.
(Continued)

*Primary Examiner* — Patrick Assouad
*Assistant Examiner* — Haidong Zhang
(74) *Attorney, Agent, or Firm* — Westerman, Hattori, Daniels & Adrian, LLP

(57) ABSTRACT

A temperature detection circuit is provided with a temperature measuring circuit, a computing circuit, a temperature monitoring circuit, and a diagnostic signal generation circuit. The temperature measuring circuit outputs, to a measurement node, a temperature measurement voltage corresponding to a temperature. The computing circuit, calculates the temperature on the basis of the temperature measurement voltage. In the cases where the temperature measurement voltage is within a predetermined abnormal voltage range, the temperature monitoring circuit validates an abnormality detection signal indicating a temperature abnormality. When fault diagnosis of the temperature monitoring circuit is carried out, the diagnostic signal generation circuit supplies a diagnostic signal to the measurement node, and changes the temperature measurement voltage.

7 Claims, 3 Drawing Sheets

(51) Int. Cl.
  *G01R 31/36* (2020.01)
  *G01R 31/374* (2019.01)
  *H01M 10/633* (2014.01)
  *G01R 31/382* (2019.01)
  *G01R 19/165* (2006.01)
  *H01M 10/42* (2006.01)
  G01R 35/00 (2006.01)
  H01M 10/613 (2014.01)

(52) U.S. Cl.
  CPC ......... *G01R 31/374* (2019.01); *G01R 31/382* (2019.01); *H01M 10/425* (2013.01); *H01M 10/633* (2015.04); *G01R 35/00* (2013.01); *H01M 10/613* (2015.04); *H01M 2010/4271* (2013.01)

(56) References Cited

FOREIGN PATENT DOCUMENTS

| JP | H07-333074 A | 12/1995 |
| JP | 2014-167418 A | 9/2014 |
| JP | 2014-185992 A | 10/2014 |
| JP | 2015-118068 A | 6/2015 |

OTHER PUBLICATIONS

International Search Report dated May 9, 2017, issued in counterpart International Application No. PCT/JP2017/002432(1 page).

\* cited by examiner

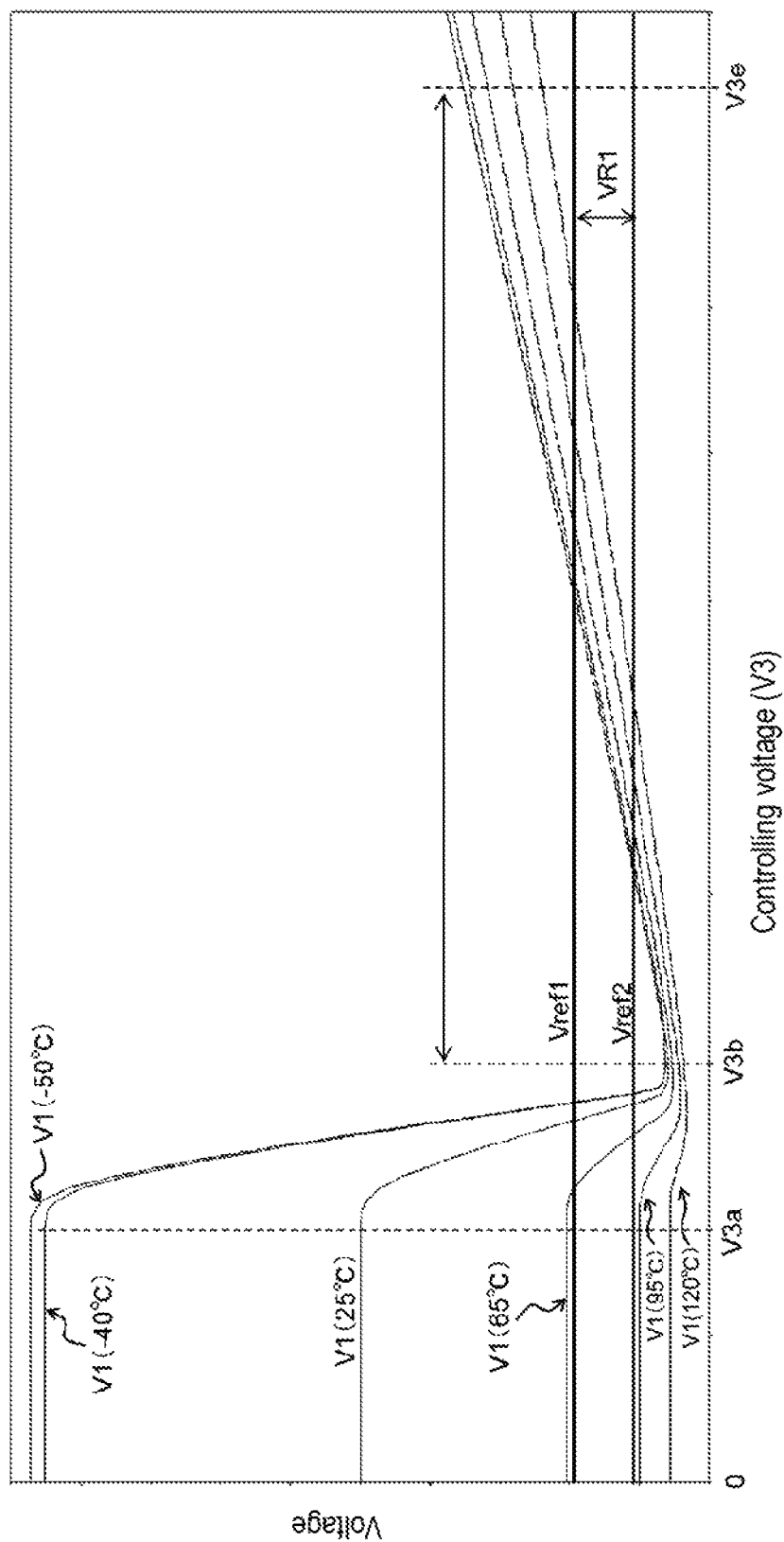

TEMPERATURE DETECTION CIRCUIT

TECHNICAL FIELD

The present invention relates to a temperature detection circuit which measures a temperature of a measuring object.

BACKGROUND ART

The following temperature detection circuit is known. The temperature detection circuit includes: a temperature measuring circuit which outputs a temperature measuring voltage corresponding to a temperature of a measuring object; and a MPU (Micro Processor Unit) which calculates the temperature based on the temperature measuring voltage. Considering a case where a temperature is not detected correctly due to a failure or trouble of the circuit of the MPU or an erroneous operation of a software, the temperature detection circuit has a temperature monitoring circuit of the redundant circuit. The temperature monitoring circuit monitors the temperature based on the temperature measuring voltage. Then, when the temperature is abnormal, the abnormality is notified to the MPU or a safety stop device. This can improve a quality and a reliability of a device which is provided with the temperature detection circuit. It is necessary to diagnose a failure or trouble of this temperature monitoring circuit at desired timings.

CITATION LIST

Patent Literature

Patent Literature 1: Unexamined Japanese Patent Publication No. 2015-118068

SUMMARY OF THE INVENTION

When the temperature becomes abnormal, such a temperature monitoring circuit is operated. Therefore, a failure or trouble of this temperature monitoring circuit cannot be diagnosed at the normal temperature. The following technology is thought, at the time of fault diagnosis, a temperature monitoring circuit and a temperature measuring circuit are separated by a switch such that a temperature measuring voltage is not provided to the temperature monitoring circuit. Then, a signal for the fault diagnosis is inputted to the temperature monitoring circuit. However, this technology increases a circuit scale and a cost.

The present invention is made in light of such circumstances, and an object of the present invention is to provide a temperature detection circuit that can diagnose a failure or trouble of a temperature monitoring circuit while suppressing an increase in a circuit scale and cost.

To solve the above-mentioned requirements, a temperature detection circuit of one aspect of the present invention, includes:

a temperature measuring circuit which outputs, to a measurement node, a temperature measurement voltage corresponding to a temperature;

a computing circuit which calculates the temperature based on the temperature measurement voltage;

a temperature monitoring circuit which validates an abnormality detection signal indicating a temperature abnormality, in a case where the temperature measurement voltage is within a predetermined abnormal voltage range; and a diagnostic signal generation circuit which supplies a diagnostic signal to the measurement node, and changes the temperature measurement voltage, when fault diagnosis of the temperature monitoring circuit is carried out.

Any desired combinations of the above described components and converted expressions of the present invention in methods, devices, systems, and other similar entities are still effective as aspects of the present invention.

According to the present invention, the failure or trouble of the temperature monitoring be detected, while suppressing a circuit scale increase and a cost increase.

BRIEF DESCRIPTION OF DRAWINGS

FIG. 3 is a figure showing a relation between a temperature measurement voltage and a controlling voltage in the temperature detection circuit of FIG. 1 at a plurality of temperature.

DESCRIPTION OF EMBODIMENTS

Figure 1:
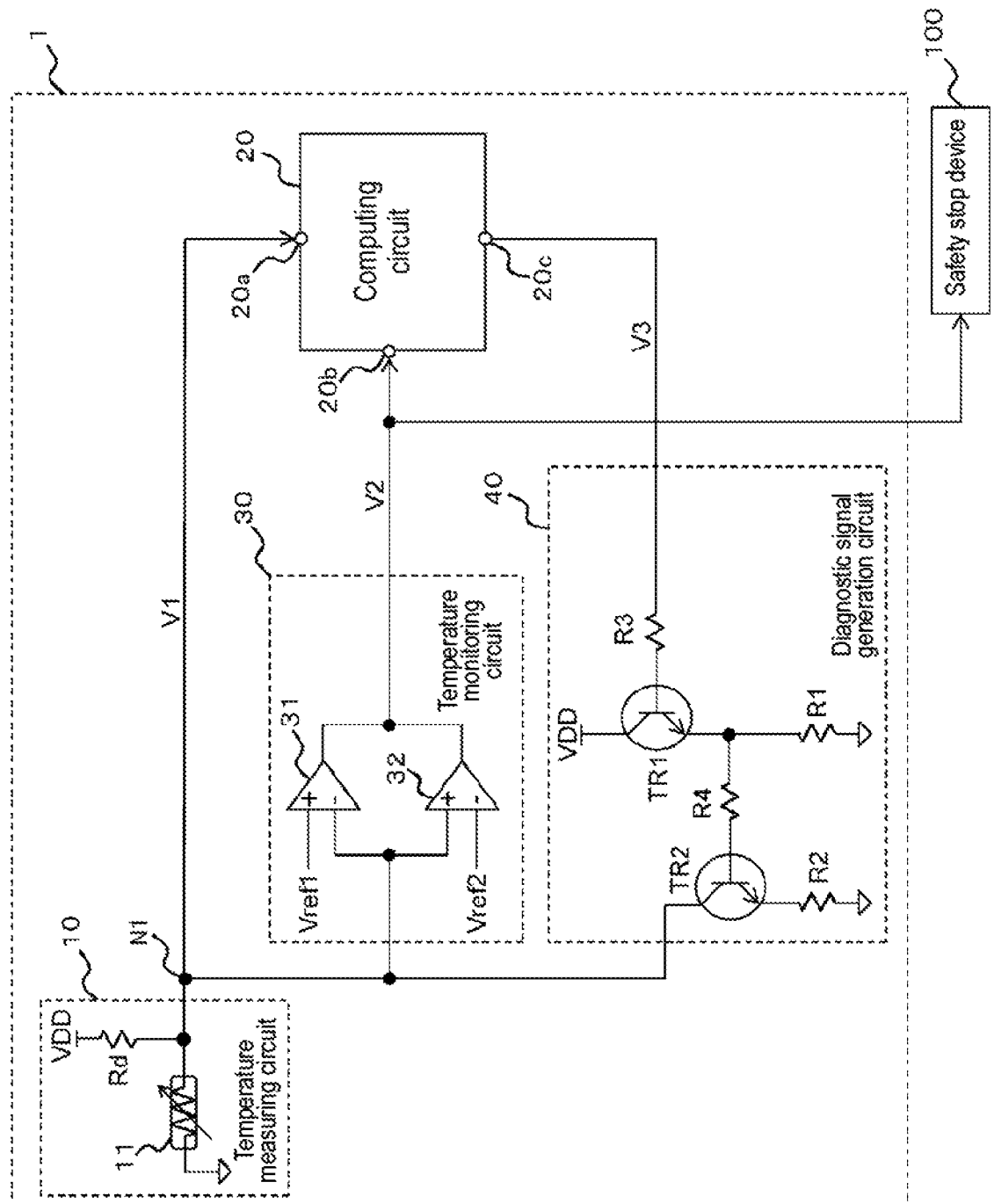
FIG. 1 is a circuit diagram of a temperature detection circuit according to an exemplary embodiment of the present invention.

FIG. 1 is a circuit diagram of temperature detection circuit 1 according to an exemplary embodiment of the present invention. Temperature detection circuit 1 is provided with temperature measuring circuit 10, computing circuit 20, temperature monitoring circuit 30, and diagnostic signal generation circuit 40.

Temperature measuring circuit 10 outputs, to measurement node N1, temperature measurement voltage V1 corresponding to a temperature a measuring object. The measuring object is not limited specifically. However, the measuring object is, for example, a power supply device for a vehicle, a power supply device for a plane, a power supply device for a ship, or a stationary power supply device. The measuring object may be a secondary battery which is included in the power supply device.

Computing circuit 20 is, for example, a MPU. Then computing circuit 20 has input terminal 20a which is connected to measurement node N1', input terminal 20b, and output terminal 20c. Computing circuit 20 calculates the temperature based on temperature measurement voltage V1 which is inputted at input terminal 20a. Computing circuit 20 includes an AD converter, and A to D converts temperature measurement voltage V1 through the AD converter, and processes the obtained digital signal, to get the temperature. When the obtained temperature is abnormal, computing circuit 20 notifies the outside of the abnormality.

A configuration of computing circuit 20 may be implemented by either cooperation of hardware and software resources or hardware resources alone. Available hardware resources include analog elements, microcomputers, DSPs, ROMs, RAMs, FPGAs, and other LSIs. The software resources may be programs such as firmware.

Temperature monitoring circuit 30 is connected to measurement node 1 and monitors the temperature based on temperature measuring voltage V1. In the cases where temperature measurement voltage V1 is within a predetermined abnormal voltage range, temperature monitoring circuit 30 validates abnormality detection signal V2 indicating a temperature abnormality. Temperature monitoring circuit 30 outputs abnormality detection signal V2 to input terminal 20b of computing circuit 20 or outside safety stop device 100. In the cases where temperature measurement voltage V1 is out of the abnormal voltage range, temperature monitoring circuit 30 invalidates abnormality detection signal V2. The abnormal voltage range corresponds the temperature range in which the abnormality occurs in the measuring object. When abnormality detection signal V2 is validated, computing circuit 20 notifies the outside of the abnormality. When abnormality detection signal V2 is validated, safety stop device 100 stops the operation of the measuring object.

By this configuration, even in a case where a temperature is not detected correctly due to a failure or trouble of computing circuit 20 or an erroneous operation of a software, when the temperature abnormality occurs in the measuring object, temperature monitoring circuit 30 can validate abnormality detection signal V2.

Computing circuit 20 diagnoses a failure or trouble of temperature monitoring circuit 30 at predetermined diagnosis timings. At the time of fault diagnosis, computing circuit 20 outputs controlling voltage V3 from output terminal 20c to diagnostic signal generation circuit 40, and confirms whether abnormality detection signal V2 is made correctly validated or invalidated, corresponding to controlling voltage V3. Accordingly, computing circuit 20 can diagnose whether or not the failure or trouble of temperature monitoring circuit 30 occurs. The diagnosis timing is, for example, the time when the measuring object is started, when the operation of the measuring object is ended, or when the measuring object is temporarily stopped. Computing circuit 20 has a DA converter. This DA converter D to A converts the digital data made by execution of the program previously stored, to generate controlling voltage V3.

Diagnostic signal generation circuit 40 is connected to measurement node N1, and supplies a diagnostic signal to measurement node N1, corresponding to controlling voltage V3, at the time of the fault diagnosis of temperature monitoring circuit 30. Then, diagnostic signal generation circuit 40 changes temperature measurement voltage V1 irrespective of the temperature of the measuring object which is measured by temperature measuring circuit 10. Concretely, at the time of the fault diagnosis, diagnostic signal generation circuit 40 changes temperature measurement voltage V1 into the value within the abnormal voltage range, corresponding to controlling voltage V3. Alternatively, at the time of the fault diagnosis, diagnostic signal generation circuit 40 can change temperature measurement voltage V1 into the value within and out of the abnormal voltage range, corresponding to controlling voltage V3.

Diagnostic signal generation circuit 40 outputs a high impedance, corresponding to controlling voltage V3, at the time except the fault diagnosis. Thus, during detecting the temperature, diagnostic signal generation circuit 40 does not affect temperature measurement voltage V1. Therefore, the temperature can be detected precisely.

One example of the circuit configuration of temperature measuring circuit 10, temperature monitoring circuit 30, and diagnostic signal generation circuit 40, is explained below. However, such a configuration is not limited to this.

Temperature measuring circuit 10 has voltage dividing resistor Rd and temperature-sensitive element 11. Voltage dividing resistor Rd has one end at which power source voltage VDD (a first fixed voltage) is supplied, and the other end which is connected to measurement node N1.

Temperature-sensitive element 11 is thermally coupled to the measuring object, so as to accurately detect the temperature of the measuring object. Temperature-sensitive element 11 is an element in which a resistance value changes corresponding to temperature. For example, temperature-sensitive element 11 is a thermistor. Temperature-sensitive element 11 has one end which is connected to measurement node N1, and the other end at which the ground voltage (a second fixed voltage) is supplied. In this embodiment, temperature-sensitive element 11 is an element in which the resistance value decreases as the temperature increases. In addition, temperature-sensitive element 11 can be the reverse characteristics.

Voltage dividing resistor Rd and temperature-sensitive element 11 constitute a voltage diving circuit. By this configuration, temperature measuring circuit 10 converts the resistance value of temperature-sensitive element 11 into temperature measurement voltage V1.

Temperature monitoring circuit 30 has comparator 31 and comparator 32.

Comparator 31 has a non-inverting input terminal Which receives reference voltage Vref1, an inverting input terminal which is connected to measurement node N1, and an output terminal which outputs abnormality detection signal V2. Comparator 32 has an inverting input terminal which receives reference voltage Vref2, a non-inverting input terminal which is connected to measurement node N1, and an output terminal which is connected to the output terminal of comparator 31.

Reference voltage Vref1 is higher than reference voltage Vref2. The abnormal voltage range is a range of reference voltage Vref2 or more, and reference voltage Vref1 or less. Comparator 31 and comparator 32 function as a window comparator.

diagnostic signal generation circuit 40 has first transistor TR1, second transistor TR2, first resistor R1, second resistor R2, third resistor R3, and fourth resistor R4.

First transistor TR1 is a NPN type bipolar transistor, and has a base which receives controlling voltage V3 through third resistor R3, a collector which receives power source voltage VDD, and an emitter.

First resistor R1 has one end which is connected to the emitter of first or TR1, and the other end which receives the ground voltage.

Second transistor TR2 is a NPN type bipolar transistor, and has a base which is connected to the emitter of first transistor TR1 through fourth resistor R4, a collector which is connected to measurement node N1, and an emitter.

Second resistor R2 has one end which is connected to the emitter of second transistor TR2, and the other end which receives the ground voltage.

First transistor TR1 and first resistor R1 constitute an emitter-follower circuit. Second transistor TR2 and second resistor R2 constitute an open collector circuit.

At the time of the fault diagnosis, diagnostic signal generation circuit 40 draws a current from measurement node N1, and increases a current which flows through voltage dividing resistor Rd. Then, diagnostic signal generation circuit 40 changes temperature measurement voltage V1 irrespective of the temperature of the measuring object which is measured by temperature measuring circuit 10. The current which diagnostic signal generation circuit 40 draws from measurement node N1, corresponds to the above-mentioned fault diagnostic signal. Concretely, corresponding to controlling voltage V3, base currents and collector currents which flows through first and second transistor TR1, TR2, change. Thereby, the current which flows through voltage dividing resistor Rd, also change. As a result, since the voltage between the collector and emitter of second transistor TR2 changes corresponding to controlling voltage V3, temperature measurement voltage V1 changes.

At the time except the fault diagnosis, controlling voltage V3 is set, for example, at 0V, and diagnostic signal generation circuit 40 stops drawing of the current. At this time, the collector of second transistor TR2 becomes the high impedance.

Figure 2:
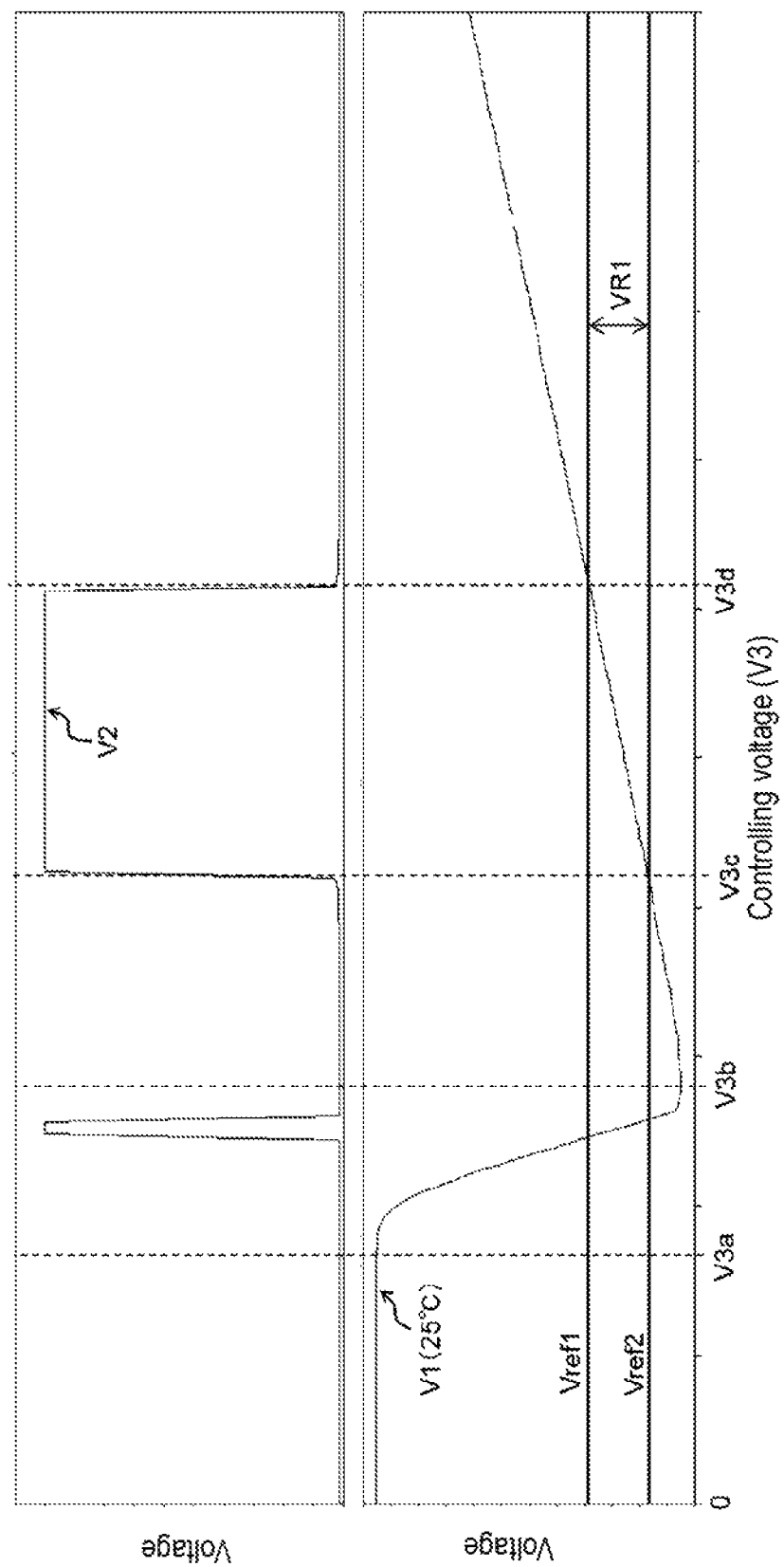
FIG. 2 is a figure showing a relation between a temperature measurement voltage and a controlling voltage of an abnormality detection signal in the temperature detection circuit of FIG. 1.

FIG. 2 is a figure showing a relation between temperature measurement voltage V1 and controlling voltage V3 of abnormality detection signal V2 in temperature detection circuit 1 of FIG. 1. In FIG. 2, the temperature of temperature-sensitive element 11 is 25° C., and temperature monitoring circuit 30 has no fault or no trouble.

When controlling voltage V3 is between 0V and voltage V3a, the collector currents of first and second transistor TR1, TR2, do not flow. Therefore, temperature measurement voltage V1 indicates the value showing 25° C. At this time, computing circuit 20 calculates the temperature as 25° C. As temperature measurement voltage V1 is out of abnormal voltage range VR1, abnormality detection signal V2 is a low level, namely, invalidated.

When controlling voltage V3 becomes voltage V3a or more, the collector current of second transistor TR2, flows. Therefore, temperature measurement voltage V1 is decreased less than the value showing 25° C.

When controlling voltage V3 becomes around voltage V3b higher than voltage V3a, the collector current of second transistor TR2, largely flows. Then, temperature measurement voltage V1 becomes the minimum value. This minimum value is lower than reference voltage Vref2. Thus, when controlling voltage V3 is between voltage V3a and voltage V3b, abnormality detection signal V2 temporarily becomes a high level, namely, validated. However, when controlling voltage V3 is voltage V3b, abnormality detection signal V2 becomes invalidated.

As controlling voltage V3 becomes higher than voltage V3b, the collector current of second transistor TR2, is decreased. Then, temperature measurement voltage V1 becomes higher than the minimum value.

When controlling voltage V3 becomes voltage V3c higher than voltage V3b, temperature measurement voltage V1 becomes equal to reference voltage Vref2. When controlling voltage V3 becomes voltage V3d higher than voltage V3c, temperature measurement voltage V1 becomes equal to reference voltage Vref1. Therefore, when controlling voltage V3 is between voltage V3c and voltage V3d, temperature measurement voltage V1 is between reference voltage Vref1 and reference voltage Vref2, namely, within abnormal voltage range VR1. In this case, abnormality detection signal V2 becomes validated.

As controlling voltage V3 becomes higher than voltage V3d, temperature measurement voltage V1 becomes higher than reference voltage Vref1. Then, in this case, abnormality detection signal V2 is invalidated.

According to the above, in the case where controlling voltage V3 is set between voltage V3c and voltage V3d, when abnormality detection signal V2 is invalidated, temperature monitoring circuit 30 can be diagnosed as the fault or trouble.

Additionally, in the case where controlling voltage V3 is set, between voltage V3b and voltage V3c, or higher than voltage V3d, when abnormality detection signal V2 is validated, temperature monitoring circuit 30 can be diagnosed as the fault or trouble. Accordingly, the error of reference voltage Vref1 or reference voltage Vref2 can be also diagnosed as the fault or trouble.

Computing circuit 20 can gradually decrease controlling voltage V3 from power source voltage VDD to voltage V3b or 0V, or can gradually increase controlling voltage V3 from voltage V3b or 0V to power source voltage VDD. Thereby, the fault or trouble can be diagnosed more accurately.

FIG. 3 is a figure showing a relation between temperature measurement voltage V1 and controlling voltage V3 in temperature detection circuit 1 of FIG. 1 at a plurality of temperature. FIG. 3 slows temperature measurement voltage V1 when the temperature of temperature measurement voltage V1 is −50° C., −40° C., 25° C., 65° C., 95° C., or 120° C.

Between 0V and voltage V3a in controlling voltage V3, temperature measurement voltage V1 shows the value corresponding to each of the temperatures. As the temperature increases, temperature measurement voltage V1 is decreased.

In the example shown in the figure, reference voltage Vref1 corresponds to 70° C. in temperature measurement voltage V1, and reference voltage Vref2 corresponds to 90° C. in temperature measurement voltage V1. At the time of detecting the temperature, when temperature measurement voltage V1 is within abnormal voltage range VR1, the temperature is 70 to 90° C., and the measuring object is abnormal, and abnormality detection signal V2 becomes validated.

In the same way as FIG. 2, as controlling voltage V3 becomes higher than voltage V3b, temperature measurement voltage V1 becomes higher than the minimum value. In the region where controlling voltage V3 is from voltage V3b to voltage V3e, in each of the temperatures of −50 to 120° C., temperature measurement voltage V1 changes from less than reference voltage Vref2 to higher than reference voltage Vref1. Therefore, by changing controlling voltage V3 from voltage V3b to voltage Vie, irrespective of the temperature of the measuring object which is measured by temperature measuring circuit 10, abnormality detection signal V2 becomes from invalidated to validated, and then becomes from validated to invalidated. Therefore, irrespective of the temperature at the time of the fault diagnosis, the fault or trouble of temperature monitoring circuit 30 can be diagnosed more accurately.

Thus, according to this embodiment, at the time of the fault diagnosis, diagnostic signal generation circuit 40 changes temperature measurement voltage V1 irrespective of the temperature of the measuring object which is, measured by temperature measuring circuit 10. Thereby, it is not necessary that a switch is disposed between measurement node N1 and temperature monitoring circuit 30 so as not to supply temperature measurement voltage V1 to temperature monitoring circuit 30. Then, under the normal temperature environment, whether or not temperature monitoring circuit 30 correctly validates abnormality detection signal V2, can be confirmed. Accordingly, the failure or trouble of temperature monitoring circuit 30 can be diagnosed, while suppressing a circuit scale increase and a cost increase.

The present invention has been described based on the exemplary embodiment. A person of the ordinary skill in the art can understand that the exemplary embodiment is illustrative only, constitution elements and combined processes can be modified, and such modified examples are covered by the scope of the present invention.

Instead of first and second transistor TR1, TR2, another switch element, for example, such as, a MOS (Metal Oxide Semiconductor) transistor can be used.

In the above example, the abnormal voltage range is set at the region where the voltage is reference voltage Vref2 or more, and reference voltage Vref1 or less. Alternatively, the abnormal voltage range can be set at the region where the voltage is a certain reference voltage or less, or at the region where the voltage is a certain reference voltage or more.

The exemplary embodiment may be specified by items described below,

[Item 1]

A temperature detection circuit (10) includes:
- a temperature measuring circuit (10) which outputs, to a measurement node (N1), a temperature measurement voltage corresponding to a temperature;
- a computing circuit (20) which calculates the temperature based on the temperature measurement voltage;
- a temperature monitoring circuit (30) which validates an abnormality detection signal indicating a temperature abnormality, in a case where the temperature measurement voltage is within a predetermined abnormal voltage range; and
- a diagnostic signal generation circuit (40) which supplies a diagnostic signal to the measurement node (N1), and changes the temperature measurement voltage, when fault diagnosis of the temperature monitoring circuit (30) is carried out.

According to this, the failure or trouble of the temperature monitoring circuit (30) can be detected, while suppressing a circuit scale increase and a cost increase.

[Item 2]

In the temperature detection circuit (1) according to item 1,
the temperature measuring circuit includes:
- a voltage dividing resistor (Rd) that has one end at which a first fixed voltage is supplied, and the other end which is connected to the measurement node (N1); and
- a temperature-sensitive element (11) which has one end which is connected to the measurement node (N1), and the other end at which a second fixed voltage is supplied, and which changes a resistance value corresponding to the temperature, the diagnostic signal generation circuit (40) draws a current from the measurement node (N1), and changes the temperature measurement voltage, at the time of the fault diagnosis.

According to this, the temperature measurement voltage can be changed irrespective of the temperature, with a simple circuit.

[Item 3]

In the temperature detection circuit (1) according to item 2,
the diagnostic signal generation circuit (40) stops drawing of the current at the time except the fault diagnosis.

According to this, during detecting the temperature, the diagnostic signal generation circuit (40) does not affect the temperature measurement voltage. Therefore, the temperature can be detected precisely.

[Item 4]

In the temperature detection circuit (1) according to item 2 or 3,
the diagnostic signal generation circuit (40) includes:
- a first transistor (TR1) that has a base which receives a controlling voltage, and a collector which receives the first fixed voltage;
- a first resistor (R1) that has one end which is connected to the emitter of the first transistor (TR1), and the other end which receives a ground voltage;
- a second transistor (TR2) that has a base which is connected to the emitter of the first transistor (TR1), and a collector which is connected to the measurement node (N1); and
- a second resistor (R2) that one end which is connected to the emitter of the second transistor (TR2), and the other end which receives the ground voltage.

According to this, the diagnostic signal generation circuit (40) can be realized with a simple configuration.

[Item 5]

In the temperature detection circuit (1) according to any one of items 1 to 4,
at the time of the fault diagnosis, the diagnostic signal generation circuit (40) changes the temperature measurement voltage into the value within the abnormal voltage range.

According to this, by confirming the validation of the abnormality detection signal, the failure or trouble of the temperature monitoring circuit (30) can be detected or diagnosed in a short time.

[Item 6]

In the temperature detection circuit (1) according to any one of items 1 to 4,
at the time of the fault diagnosis, the diagnostic signal generation circuit (40) changes the temperature measurement voltage into the value within and out of the abnormal voltage range.

According to this, when the temperature measurement voltage is changed into the value within the abnormal voltage range, whether or not the abnormality detection signal is validated, is confirmed. When the temperature measurement voltage is changed into the value out of the abnormal voltage range, whether or not the abnormality detection signal is invalidated, is confirmed. Thereby, the fault or trouble of the temperature monitoring circuit (30) can be diagnosed more accurately. Additionally, the fault or trouble of the temperature monitoring circuit (30) may be diagnosed or detected by confirming either of the following (a) and (b).

(a): when the temperature measurement voltage is changed into the value within the abnormal voltage range, the abnormality detection signal is validated.

(b): when the temperature measurement voltage is changed into the value out of the abnormal voltage range, the abnormality detection signal is invalidated.

[Item 7]

In the temperature detection circuit (1) according to item 4,
at the time of the fault diagnosis, the computing circuit (20) gradually decreases the controlling voltage from the first fixed voltage, or can gradually increases the controlling voltage from the ground voltage.

According to this, the fault or trouble of the temperature monitoring circuit (30) can be diagnosed more accurately.

[Item 8]

In the temperature detection circuit (1) according to any one of items 1 to 7,
the temperature measuring circuit (10) outputs the temperature measurement voltage corresponding to a temperature of a secondary battery, and
the abnormal voltage range corresponds the temperature range in which the abnormality occurs in the secondary battery.

According to this, the abnormality of the secondary battery can be detected.

REFERENCE MARKS IN THE DRAWINGS 1 temperature detection circuit
10 temperature measuring circuit
11 temperature-sensitive element
Rd voltage dividing resistor 20 computing circuit
30 temperature monitoring circuit
40 diagnostic signal generation circuit
R1 first resistor
TR1 first transistor
R2 second resistor
TR2 second transistor

The invention claimed is:

1. A temperature detection circuit comprising:
a temperature measuring circuit which outputs, to a measurement node, a temperature measurement voltage corresponding to a temperature;
a computing circuit which calculates the temperature based on the temperature measurement voltage;
a temperature monitoring circuit which validates an abnormality detection signal indicating a temperature abnormality, in a case where the temperature measurement voltage is within a predetermined abnormal voltage range; and
a diagnostic signal generation circuit which supplies a diagnostic signal to the measurement node, and changes the temperature measurement voltage, when fault diagnosis of the temperature monitoring circuit is carried out, wherein,
the temperature measuring circuit includes:
a voltage dividing resistor that has one end at which a first fixed voltage is supplied, and the other end which is connected to the measurement node; and
a temperature-sensitive element which has one end which is connected to the measurement node, and the other end at which a second fixed voltage is supplied, and which changes a resistance value corresponding to the temperature,
the diagnostic signal generation circuit draws a current from the measurement node, and changes the temperature measurement voltage, at the time of the fault diagnosis.

2. The temperature detection circuit according to claim 1, wherein,
the diagnostic signal generation circuit stops drawing of the current at the time except the fault diagnosis.

3. The temperature detection circuit according to claim 1, wherein,
the diagnostic signal generation circuit includes:
a first transistor that has a base which receives a controlling voltage, and a collector which receives the first fixed voltage;
a first resistor that has one end which is connected to the emitter of the first transistor, and the other end which receives a ground voltage;
a second transistor that has a base which is connected to the emitter of the first transistor, and a collector which is connected to the measurement node; and
a second resistor that one end which is connected to the emitter of the second transistor, and the other end which receives the ground voltage.

4. The temperature detection circuit according to claim 1, wherein,
at the time of the fault diagnosis, the diagnostic signal generation circuit changes the temperature measurement voltage into the value within the abnormal voltage range.

5. The temperature detection circuit according to claim 1, wherein,
at the time of the fault diagnosis, the diagnostic signal generation circuit changes the temperature measurement voltage into the value within and out of the abnormal voltage range.

6. The temperature detection circuit according to claim 3, wherein,
at the time of the fault diagnosis, the computing circuit gradually decreases the controlling voltage from the first fixed voltage, or can gradually increases the controlling voltage from the ground voltage.

7. The temperature detection circuit according to claim 1, wherein,
the temperature measuring circuit outputs the temperature measurement voltage corresponding to a temperature of a secondary battery, and
the abnormal voltage range corresponds the temperature range in which the abnormality occurs in the secondary battery.

* * * * *